(12) United States Patent
Brashear et al.

(10) Patent No.: US 11,923,221 B2
(45) Date of Patent: Mar. 5, 2024

(54) METHODS AND ASSEMBLIES FOR GAS FLOW RATIO CONTROL

(71) Applicant: Applied Materials, Inc., Santa Clara, CA (US)

(72) Inventors: Kevin Brashear, San Jose, CA (US); Ashley M. Okada, San Jose, CA (US); Dennis L. Demars, Santa Clara, CA (US); Zhiyuan Ye, San Jose, CA (US); Jaidev Rajaram, Bangalore (IN); Marcel E. Josephson, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/935,810

(22) Filed: Sep. 27, 2022

(65) Prior Publication Data
US 2023/0017206 A1 Jan. 19, 2023

Related U.S. Application Data

(60) Continuation of application No. 16/659,332, filed on Oct. 21, 2019, now Pat. No. 11,462,426, which is a (Continued)

(51) Int. Cl.
*C23C 16/455* (2006.01)
*G05D 11/13* (2006.01)
*H01L 21/67* (2006.01)

(52) U.S. Cl.
CPC ...... *H01L 21/67253* (2013.01); *G05D 11/132* (2013.01); *H01L 21/67017* (2013.01)

(58) Field of Classification Search
CPC ........ C23C 16/45512; C23C 16/45561; G05D 7/0617; G05D 11/132; H01L 21/67017; H01L 21/67253
See application file for complete search history.

(56) References Cited

U.S. PATENT DOCUMENTS

| 5,496,408 A | 3/1996 | Motoda et al. |
| 5,589,110 A | 12/1996 | Motoda et al. |

(Continued)

FOREIGN PATENT DOCUMENTS

| CN | 1533523 A | 9/2004 |
| CN | 101256935 A | 9/2008 |

(Continued)

OTHER PUBLICATIONS

International Preliminary Report on Patentability of International Application No. PCT/US2017/021724 dated Sep. 27, 2018.

(Continued)

*Primary Examiner* — Paul J Gray
(74) *Attorney, Agent, or Firm* — Lowenstein Sandler LLP

(57) ABSTRACT

A master controller determines a first flow setpoint for a process flow gas and/or a carrier gas flow through a first mass flow controller. The master controller obtains a back pressure setpoint of a distribution manifold and determines a second flow setpoint for the process gas flow and/or the carrier gas flow through a second mass flow controller or a back pressure controller based on the determined first flow setpoint and the obtained back pressure setpoint. The master controller controls the process gas flow and/or the carrier gas flow through the first mass flow controller to the first flow setpoint and the second mass flow controller and/or the back pressure controller to the second flow setpoint. The master controller controls the back pressure of the distribution manifold to the back pressure set point in view of a back pressure reading from a back pressure sensor of the distribution manifold.

20 Claims, 9 Drawing Sheets

Related U.S. Application Data division of application No. 15/070,342, filed on Mar. 15, 2016, now Pat. No. 10,453,721.

(56) References Cited

U.S. PATENT DOCUMENTS

| | | |
|---|---|---|
| 5,647,945 A | 7/1997 | Matsuse et al. |
| 6,217,937 B1 | 4/2001 | Shealy |
| 6,277,347 B1 | 8/2001 | Stearns et al. |
| 7,360,551 B2 | 4/2008 | Lull et al. |
| 7,452,827 B2 | 11/2008 | Gianoulakis et al. |
| 7,846,497 B2 | 12/2010 | Gold et al. |
| 8,003,067 B2 | 8/2011 | Curry et al. |
| 8,066,895 B2 | 11/2011 | Belen et al. |
| 8,361,892 B2 | 1/2013 | Tam et al. |
| 8,397,739 B2 | 3/2013 | Gregor et al. |
| 8,512,509 B2 | 8/2013 | Bera et al. |
| 8,668,868 B2 | 3/2014 | Chiu et al. |
| 8,707,754 B2 | 4/2014 | Cruse et al. |
| 9,004,107 B2 | 4/2015 | Gregor et al. |
| 9,200,754 B2 | 12/2015 | Gregor et al. |
| 10,269,600 B2 | 4/2019 | Brashear et al. |
| 10,453,721 B2 | 10/2019 | Brashear et al. |
| 2002/0042205 A1 | 4/2002 | McMillin et al. |
| 2004/0050326 A1 | 3/2004 | Thilderkvist et al. |
| 2004/0082251 A1 | 4/2004 | Bach et al. |
| 2006/0086319 A1 | 4/2006 | Kasai et al. |
| 2009/0056544 A1 | 3/2009 | Vermeulen |
| 2009/0175771 A1 | 7/2009 | Tsai et al. |
| 2010/0119984 A1 | 5/2010 | Fox |
| 2010/0192773 A1 | 8/2010 | Clark et al. |
| 2010/0219157 A1 | 9/2010 | Matsumoto |
| 2010/0224264 A1 | 9/2010 | Homan et al. |
| 2012/0244685 A1 | 9/2012 | Suzuki et al. |
| 2013/0056036 A1 | 3/2013 | Tousimis |
| 2013/0220221 A1 | 8/2013 | Sanchez et al. |
| 2013/0233401 A1 | 9/2013 | Gregor et al. |
| 2015/0005955 A1 | 1/2015 | Gregor |
| 2015/0005956 A1 | 1/2015 | Gregor |
| 2015/0194304 A1 | 7/2015 | Hirochi et al. |
| 2017/0271183 A1 | 9/2017 | Brashear et al. |
| 2017/0271184 A1 | 9/2017 | Brashear et al. |
| 2019/0206707 A1 | 7/2019 | Brashear et al. |

FOREIGN PATENT DOCUMENTS

| | | |
|---|---|---|
| JP | H09-330128 A | 10/1994 |
| JP | H09-330128 A | 12/1997 |
| JP | 2000-077394 A | 3/2000 |
| JP | 2006057162 A | 3/2006 |
| JP | 2006066855 A | 3/2006 |
| JP | 2007321833 A | 12/2007 |
| JP | 2008198203 A | 8/2008 |
| JP | 2008543563 A | 12/2008 |
| JP | 2011233905 A | 11/2011 |
| JP | 2015195312 A | 11/2015 |
| KR | 10-2004-0019293 A | 3/2004 |
| KR | 10-2008-0079210 A | 8/2008 |
| TW | 201017357 A | 5/2010 |
| TW | 201528412 A | 7/2015 |
| WO | 2002/095519 A1 | 11/2002 |
| WO | 2007002288 A2 | 1/2007 |

OTHER PUBLICATIONS

International Preliminary Report on Patentability of International Application No. PCT/US2017/021722 dated Sep. 27, 2018.

International Search Report and Written Opinion of International Application No. PCT/US2017/021722 dated Jun. 20, 2017.

International Search Report and Written Opinion of International Application No. PCT/US2017/021724 dated Jun. 20, 2017.

Chinese Search Report of Chinese Patent Application No. 201780016905X dated Jul. 19, 2021, 2 pages.

Taiwan Search Report of Taiwan Patent Application No. 110116158 dated Jun. 9, 2022, 1 page.

Taiwan Search Report of Taiwan Patent Application No. 110116158 dated Aug. 11, 2021, 1 page.

Taiwan Search Report of Taiwan Patent Application No. 106106324 dated May 27, 2020, 1 page.

Taiwan Search Report of Taiwan Patent Application No. 106107726 dated Jun. 3, 2020, 1 page.

METHODS AND ASSEMBLIES FOR GAS FLOW RATIO CONTROL

RELATED APPLICATIONS

The present application is a continuation application of U.S. patent application Ser. No. 16/659,332, filed Oct. 21, 2019, which is a divisional application of U.S. patent application Ser. No. 15/070,342, filed Mar. 15, 2016, now U.S. Pat. No. 10,453,721, issued Oct. 22, 2019, which are incorporated by reference herein.

FIELD

The present invention generally relates to gas flow control to process chambers for electronic device manufacturing, and more particularly to methods and assemblies for gas flow ratio control.

BACKGROUND

Semiconductor processing wherein a substrate is processed in a process chamber can be particularly sensitive to process gas flow rate variations and perturbations. In particular, variations may affect one or more critical dimensions and/or film thicknesses during processing, for example. Thus, gas delivery assemblies for semiconductor processing chambers attempt to deliver steady flows at precise flow rates, flow ratios, and pressures to multiple input ports of a process chamber.

Prior art gas delivery assemblies may utilize flow-splitting methods to improve flow ratio accuracy, repeatability, and reproducibility in multi-injection point and/or multi-chamber processing systems. Flow splitting can be provided by using a plurality of mass flow controllers (MFCs), which actively attempt to control the relative flow rates of gases dispensed at the multiple input port locations. However, as new chamber processing technologies continue to achieve smaller critical dimensions for microelectronic devices, even higher degrees of flow control precision, and in particular, flow ratio control, are beneficial. Therefore, methods and assemblies are desirable for making gas flow rate control, and in particular, flow ratio control, more precise.

In one or more embodiments, a method of controlling flow of a gas to a process chamber is provided. The method includes providing a distribution manifold fluidly coupled to the a process chamber, providing one or more mass flow controllers fluidly coupled between the process chamber and the distribution manifold, providing a back pressure controller fluidly coupled to the distribution manifold, controlling flow through each of the one or more mass flow controllers to a dynamically-controllable flow set point, and controlling back pressure upstream of the back pressure controller to a back pressure set point.

In some embodiments, a gas flow control assembly is provided. The gas flow control assembly includes a controller, a process gas supply, a distribution manifold fluidly coupled to the process gas supply, a pressure sensor coupled to the distribution manifold and operatively connected to sense gas pressure in the distribution manifold, a process chamber, one or more mass flow controllers, each mass flow controller fluidly and operatively connected to the distribution manifold and the process chamber to control gas flow there between, and a back pressure controller fluidly and operatively connected to the distribution manifold.

In further embodiments, a gas flow control assembly is provided. The gas flow control assembly includes a controller, a process gas supply, a distribution manifold fluidly coupled to the process gas supply, the distribution manifold having at least two outlets, a back pressure sensor operatively connected to the controller and configured to sense gas pressure in the distribution manifold, a process chamber, one or more mass flow controllers, each of the one or more mass flow controllers fluidly and operatively connected to an outlet of the distribution manifold and to a zone of the process chamber to control gas flow percentage into each zone, a back pressure controller fluidly connected to the distribution manifold and operatively connected to the controller to control the back pressure controller to a back pressure set point responsive to output from the back pressure sensor.

In further embodiments, a method of controlling flow of a gas to a process chamber is provided. The method includes providing a distribution manifold fluidly coupled to a process chamber, providing a process gas supply fluidly coupled to the distribution manifold, the process gas supply including an upstream pressure controller operationally coupled to a carrier gas, and one or more process gases whose flow is controlled by one or more supply mass flow controllers, providing one or more mass flow controllers fluidly coupled between the process chamber and the distribution manifold; controlling gas flow through each of the one or more mass flow controllers to a dynamically-controllable flow set point, and controlling back pressure of the distribution manifold to a back pressure set point by controlling carrier gas flow with the upstream pressure controller.

According to one or more embodiments, a gas flow control assembly is provided. The gas flow control assembly includes a controller, a process gas supply including a carrier gas and one or more process gases, a distribution manifold fluidly coupled to the process gas supply, a back pressure sensor fluidly connected to the distribution manifold and configured to sense back pressure in the distribution manifold, a process chamber including a plurality of zones, a plurality of mass flow controllers, each of the mass flow controllers fluidly and operatively connected between the distribution manifold and the process chamber and configured to control gas flow into the plurality of zones of the process chamber, and an upstream pressure controller fluidly and operatively connected to the distribution manifold and configured to control flow of the carrier gas responsive to a back pressure set point supplied by the controller.

In yet another embodiment, a gas flow control assembly is provided. The gas flow control assembly includes a controller, a process gas supply including a carrier gas and one or more process gases configured to be mixed at a junction, a distribution manifold fluidly coupled to the process gas supply downstream of the junction, the distribution manifold having a plurality of outlets, a back pressure sensor operatively connected to the controller and configured to sense back pressure in the distribution manifold, a process chamber including a plurality of zones, one or more mass flow controllers, each of the one or more mass flow controllers fluidly and operatively connected to an outlet of the distribution manifold and to one of the plurality of zones to control a gas flow ratio into each of the plurality of zone, and an upstream pressure controller fluidly connected to the carrier gas upstream of the junction, and operatively connected to the controller to control the back pressure to a back pressure set point responsive to an output signal from the back pressure sensor.

Numerous other features are provided in accordance with these and other aspects of the invention. Other features and aspects of embodiments of the present invention will become more fully apparent from the following description, the appended claims, and the accompanying drawings.

DESCRIPTION

Figure 1:
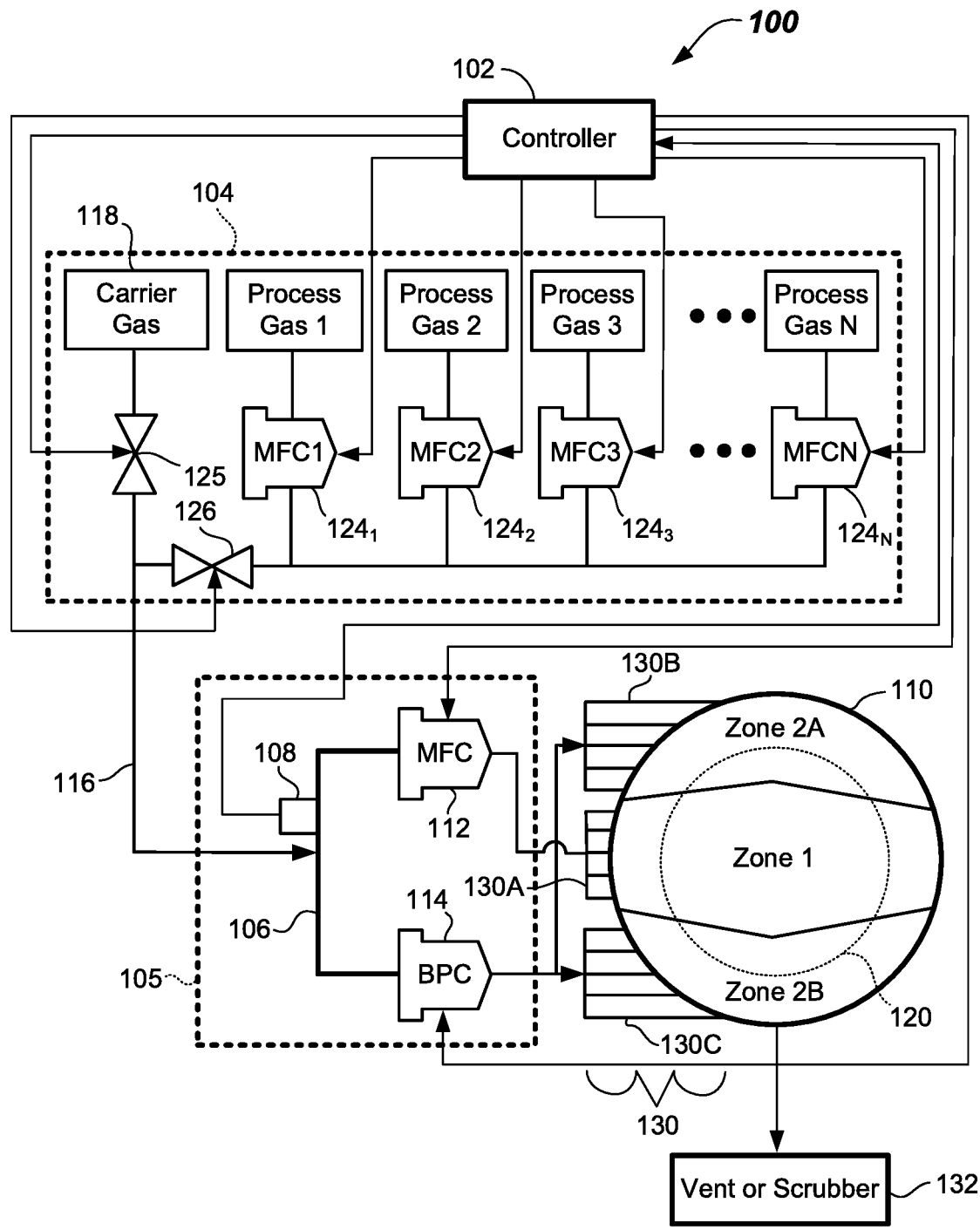
FIG. 1 illustrates a schematic top view of a gas flow control assembly including a mass flow controller and a back pressure controller according to one or more embodiments.

The present inventions provides improved methods and assemblies for controlling gas flow into a process chamber, such as semiconductor process chamber, or the like. In particular, embodiments of the present invention reduce flow variations, dithering, and/or flow starvation of the mass flow controllers (hereinafter MFCs) in the assembly as the MFCs compete for gas flow in order to meet desired flow set points controlling flow ratios for each MFC.

Prior art methods of gas flow ratio control do not attempt to achieve steady state flow through MFCs coupled to the process chamber. Each prior art MFC is set to its flow set point, which is generally a percentage of the total flow, and thus attempts to maintain constant flow at that set point percentage. However, any variation in the incoming flow causes back pressure variations and causes the various MFCs to adjust their flow requirements. If the pressure is low, the only way to achieve more flow through a certain MFC is by starving another. Thus, transient flow through the MFCs is provided where all the MFCs in the assembly constantly compete with one another to achieve their respective flow set points. As a result, undesirable flow variations may occur to each of the process chamber inlet ports. This may impact process quality and/or uniformity. This may cause non-uniform etch or deposition, in some embodiments, for example. Embodiments of the present invention may substantially eliminate this competition between the MFCs and provided precise flow set point control and flow ratio control Further, embodiments of the present invention may allow the use of a simple feedback control method to control percentage set points to the desired flow ratios.

One or more embodiments of the present invention provide a novel combination of MFCs and a back pressure controller in a flow ratio apparatus in order to precisely control the respective flow ratios of the MFCs. Example embodiments of gas flow control assemblies and methods including a back pressure controller for controlling flow of a gas to a processing chamber are described herein with reference to FIGS. 1-4 and 8.

Example embodiments of gas flow control assemblies and methods including an upstream pressure controller configured to control pressure of a carrier gas exiting from a process gas supply for controlling flow of gas and gas flow ratios to a processing chamber are described with reference to FIGS. 4-7 and 9 herein.

Now referring to FIG. I, a first example embodiment of a gas flow control assembly 100 according to the present invention is depicted. The gas flow control assembly 100 includes a controller 102 (e.g., a digital controller with processor), a process gas supply 104, and a flow ratio apparatus 105 fluidly coupled to the process gas supply 104. The flow ratio apparatus 105 may include a distribution manifold 106 fluidly coupled to the process gas supply 104, which may provide a carrier gas and one or more process gases (e.g., process gases 1 through process gas N) to be used in the processing taking place in the process chamber 110.

The phrase "fluidly coupled" as used herein means that the components are coupled by conduits adapted to carry a fluid (e.g., gas) there through. The flow ratio apparatus 105 of the gas flow control assembly 100 further includes a back pressure sensor 108 that may be fluidly and operatively connected to the distribution manifold 106 and operatively connected to the controller 102 and configured to sense gas pressure within the distribution manifold 106 and provide to the controller an output signal thereof to be used for flow ratio control as will be apparent from the following.

The gas flow control assembly 100 further includes the process chamber 110, which receives gas flow from the flow ratio apparatus 105. The flow ratio apparatus 105 includes one or more mass flow controllers (MFCs) 112 (one shown in the depicted embodiment), wherein each MFC 112 is fluidly and operatively connected to the distribution manifold 106 and to the process chamber 110 and operatively connected to the controller 102 to control gas flow to one or more zones (e.g., Zone 1, Zone 2A, Zone 2B) of the process chamber 110. The process chamber 110 may be any chamber where a process takes place on a substrate 120 (shown dotted), such as an etch process chamber, a deposition process chamber (e.g., atomic layer deposition (ALD), physical vapor deposition (PVD), or chemical vapor deposition (CVD) deposition), epitaxial deposition, a cleaning process chamber, or the like.

The flow ratio apparatus 105 further includes a back pressure controller 114 fluidly and operatively connected to the distribution manifold 106. In the depicted embodiment of FIG. 1, the back pressure controller 114 may also be fluidly coupled to the processing chamber 110. In the depicted embodiment, a single MFC 112 and a single back pressure controller 114 are provided in fluid parallel relationship. However, later embodiments will include a plurality of MFCs 112A, 112B in parallel with a single back pressure controller 114.

The MFC 112 is a device used to measure and control the flow of gases. The MFC 112 is designed and calibrated to control a specific or range of types of gas at a particular range of flow rates. The MFC 112 can be given a dynamically-adjustable set point from 0% to 100% of its full scale range, but is typically operated at about 10% to about 90% of full scale range where the best accuracy may be achieved. The MFC 112 will then control the rate of flow to an individual flow set point. MFCs can be either analog or digital. A multi-gas and multi-range MFC is generally able to control more than one type of gas, and is therefore preferred in cases where more than one gas recipe from the process gas supply 104 is supplied to the process chamber 110. A standard MFC may be used, but may be limited to a particular gas recipe for which it was calibrated.

All MFCs 112 have an inlet port, an outlet port, an internal mass flow sensor, and a proportional control valve which is actuatable by an actuator (e.g., and suitable motor or automated motion causing element). The MFC 112 may be generally fitted with a closed loop control system, which may be given a flow set point control signal by the controller 102 that is then compared to the value from the internal mass flow sensor and adjusts the proportional valve via actuation to achieve the desired flow rate. The flow set point control signal may be generally specified as a percentage (a flow ratio) of its calibrated full scale flow and may be supplied to the MFC 112 as a voltage from the controller 102. In some embodiments, the closed loop control system is provided as circuitry within the MFC 112, which is operatively connected to the controller 102 and receives the flow set point control signal therefrom. In other embodiments, the closed loop control may be accomplished solely by controller 102. All MFCs described herein are of this construction.

In the depicted embodiment, the MFC 112 is provided with a supply of gas at the inlet port thereof from the distribution manifold 106 and at a designated back pressure that is set by the controller 102. Because the BPC 114 ensures that a desired back pressure is achieved in the distribution manifold 106, the MFC 112 of the present embodiment cannot be starved of gas and thus enables the flow set point and flow ratio to be precisely achieved.

In the depicted embodiments, each of the MFCs 112 may be any suitable model of a mass flow controller having a normally closed valve, for example, such as those available from HORIBA located in Kyoto, Japan. The MFCs 112 may be capable of handling flow rates of between about 10 sccm and 200 slm, for example. For all embodiments described herein, the back pressure controller 114 may be any suitable pressure controller or pressure regulator for closed loop control of back pressure, such as a Digital Auto Pressure Regulator available from HORIBA located in Kyoto, Japan, or an integrated pressure controller for closed-loop pressure control available from MKS of Andover, Mass. Back pressure controller 114 includes an internal control valve that is actuatable via an internal actuator and may include internal digital electronics to provide a feedback control loop and actuation signal to control the backpressure to a desired pressure set point communicated to the back pressure controller by controller 102. Backpressure sensor 108 may be internally located in the back pressure controller 114 in some embodiments to sense backpressure in the distribution manifold 106. Closed loop control may optionally be carried out solely by the controller 102 or by any combination of the controller 102 and the internal digital electronics.

As shown in FIG. 1, the process gas supply 104 is fluidly and operatively connected to, and feeds process gas to, the distribution manifold 106 of the flow ratio apparatus 105 through feed line 116. Feed line 116 may be a conduit or collection of conduits. The process gas supply 104 may include a plurality of different gases that may be mixed, as desired, for various processes that take place in the process chamber 110. For example, in one embodiment, a carrier gas 118 may be provided, which is mixed with one or more process gases (Process Gas 1-N). Carrier gas 118 may be any suitable gas for carrying process gases, such as a nitrogen gas, hydrogen gas, an inert gas such as Helium, Argon, or combinations thereof.

The process gas supply 104 may also include one or more process gases, such as the plurality of process gases (e.g., Process Gas 1, Process Gas 2, Process Gas 3, and up to Process Gas N). Process Gases 1-N may be used in carrying out one or more processes on a substrate 120 contained in the process chamber 110. The substrate 120 may be an electronic device precursor article, such as a semiconductor wafer, crystalline silicon wafer, silicon wafer, doped silicon wafer, doped or un-doped polysilicon wafers, masked silicon wafer, patterned or unpatterned silicon wafer, or a silicon-containing disc or plate, other silicon-containing article, or the like. Substrate 120 may be stationed and supported for processing on a suitable support within the process chamber 110, such as a pedestal or lift, pins, for example. The process chamber 110 may be a semiconductor processing chamber adapted to process a substrate 120 therein. The Process Gases 1-N may be a reductant gas such as Oxygen ($O_2$), Carbon Dioxide ($CO_2$), Nitrogen Oxide (NO), Nitrous Oxide ($N_2O$), Nitrogen Dioxide ($NO_2$), Methane ($CH_4$), Carbon tetrafluoride ($CF_4$), Tetrafluoromethane ($CHF_4$), Trifluormethane ($CHF_3$), Difluoromethane ($CH_2F_2$), Chlorine Trifluoride ($ClF_3$), Sulfur Hexafluoride ($SF_6$), Hexafluorobutadiene ($C_4F_6$), Hexafluoroethane ($C_2F_6$), Octafluorocyclobutane ($C_4F_8$), Octafluorocyclopentene ($C_5F_8$), Octafluoropropane ($C_3F_8$), Propylene ($C_3H_6$), Nitrogen Trifluoride ($NF_3$), Dichlorsilane ($H_2SiCl_2$), Phosphine ($PH_3$), Silane ($SiH_4$), Trichlorsilane (TCS), Trimethylsilane (3MS), Boron Trichloride ($BCl_3$), Chlorine ($Cl_2$), Ammonia ($NH_3$), Germane ($GeH_4$), Tungsten Hexafluoride ($WF_6$), Xenon (Xe), or the like, for example. Other suitable process gases may be used.

In more detail, the process gas supply 104 may include a plurality of supply MFCs, such as supply MFC $124_1$ through supply MFC $124_N$, wherein N may be equal to the number of process gases that are present thereat. For example, there may be three or more supply MFCs, such as supply MFCs $124_1$, $124_2$ $124_3$ and $124_N$. Other numbers of process gases and supply MFCs may be used. The process gas supply 104 may further include control valves 125, 126 operatively connected to the controller 102 to control the relative flow and ratio of the carrier gas 118 to process gases (Process Gas 1, Process Gas 2, Process Gas 3, . . . Process Gas N) and thus control not only the ratio of carrier gas 118 to process gas, but also the total gas flow provided to the distribution manifold 106 of the flow ratio apparatus 105. The process gas flow set points for each of the supply MFC 124I-124N, as well as the flow through control valves 125, 126 are determined and set by controller 102 according to the desired recipe for the particular process or stage of the process taking place at the process chamber 110 at that time.

The process gas supply 104 is operatively coupled to and provided in fluid communication with the flow ratio apparatus 105, which includes the distribution manifold 106, one or more MFCs 112, back pressure controller 114, and the back pressure sensor 108. Depending on the process recipes to be supplied during semiconductor substrate processing, the number of different process gases supplied to the flow ratio apparatus 105 from the supply MFCs $124_1$-$124_N$ may vary. Moreover, the relative ratios of the total flow to various zones (e.g., Zone 1, Zone 2A, and Zone 2B) of the process chamber 110 may also be varied.

As such, the process chamber 110 may be adapted to receive gases in more than one zone within the process chamber 110 and thus an output manifold 130 may be provided that is coupled to the one or more MFC 112 and the BPC 114 and may include multiple manifold sections 130A-130C feeding into the process chamber 110 at multiple zones. The flow ratio apparatus 105 functions to allow flow of the gas through the one or more mass flow controllers 112 and the back pressure controller 114 and into one or more zones (e.g., Zone 1, Zone 2, zone 2B) of the process chamber 110. Different flows to two or more zones may be provided.

As depicted in FIG. 1, the flow ratio apparatus 105 may be coupled to the output manifold 130 that may couple at their respective outputs of output manifold sections 130A-130C to multiple zones (e.g., zone 1, zone 2A and Zone 2B) of the process chamber 110. For example, flow from the MFC 112 may be routed to an inner zone (e.g., zone 1) by output manifold section 130A and gas flow from the back pressure controller 114 may be provided to one or more outer zones (e.g., zone 2A and zone 2B) by output manifold sections 130B, 130C. The output manifold sections 130A, 130B, 130C may include multiple output channels that may be distributed within each respective zone, for example. In some embodiments, the zones (e.g., Zone 1, Zone 2A, and Zone 2B) may be arranged horizontally across the process chamber 110, as shown. In other embodiments, multiple zones may be arranged as one or more concentric rings arranged around a circular center zone. Other zone arrangements may be used to provide zonal gas flow control. In other embodiments, some outputs may be arranged at a top of the process chamber 110 while other may be arranged on a side or even on a bottom of the process chamber 110 or any combination thereof. Multiple output ports to each zone (e.g., Zone 1, Zone 2A, and Zone 2B) may be provided.

In the depicted embodiment, the MFC 112 is controlled to a flow set point by way of interaction and communication with the controller 102. The flow set point of the MFC 112 may be set such that a desired ratio (e.g., 60%) of the total flow provided in feed line 116 from gas supply 104 is provided to Zone 1, for example. The remaining gas flow to the Zone 2A and Zone 2B may then be set based upon a designed back pressure that is desired in the distribution manifold 106. In particular, the back pressure controller 114 is configured and operable to control the backpressure to a predetermined back pressure set point (Pb). For example, the designed back pressure set point (Pb) may be between about 50 Torr and about 1600 Torr, and about 350 Torr in some embodiments, for example. Other back pressure set points (Pb) may be used. In some embodiments, the back pressure set point (Pb) may be set based upon the pressure of the gas supply minus the pressure of the process chamber 110.

In other embodiments, more than one MFC 112 may be used. For example, a first MFC 112 coupled to the distribution manifold 106 may control a first flow ratio to a first zone (e.g., Zone 1) and a second MFC (not shown) coupled to the distribution manifold 106 may control a second flow ratio to a second zone (e.g., Zone 2A) whereas the BPC 114 may control flow to the third zone (e.g., zone 2B) responsive to the desired back pressure set point (Pb). Even more numbers of MFCs may be used to provide even finer flow ratio control to additional zones of the process chamber 110. In this manner, the multiple MFCs do not fight with one another for flow, because the flow ratio through each MFC can be controlled to very tight tolerances, such as even +/−1% or less. Likewise, a tight tolerance of about +/−1% or less can be provided for the flow set point for each MFC 112.

Controller 102 herein may include a suitable processor, memory, and software, firmware, or combinations thereof, A/D converters, conditioning electronics, and/or drivers to control the flow from the process gas supply 104, control the each MFC 112 to the desired flow set point and receive back pressure signals in order to control the back pressure in the distribution manifold 106 via control signals to the back pressure controller 114 of the desired back pressure set point (Pb). The desired back pressure set point (Pb) may be responsive to the pressure signals received by controller 102 by back pressure sensor 108. Flow set point may be set between about 0.5% and 99.5% of the total full range flow in the depicted embodiment, for example. In some embodiments, the flow set point should be between about 5% and about 95%. In some embodiments, the sensor 108 may be provided as an integral part of the with BPC 114, and internal closed loop electronics of the BPC 114 may then control the back pressure to the back pressure set point (Pb) supplied to the internal closed loop electronics by controller 102 that is communicatively connected thereto. In other embodiments, closed loop control may be accomplished by any suitable combination of the internal closed loop electronics and the controller 102.

Figure 2:
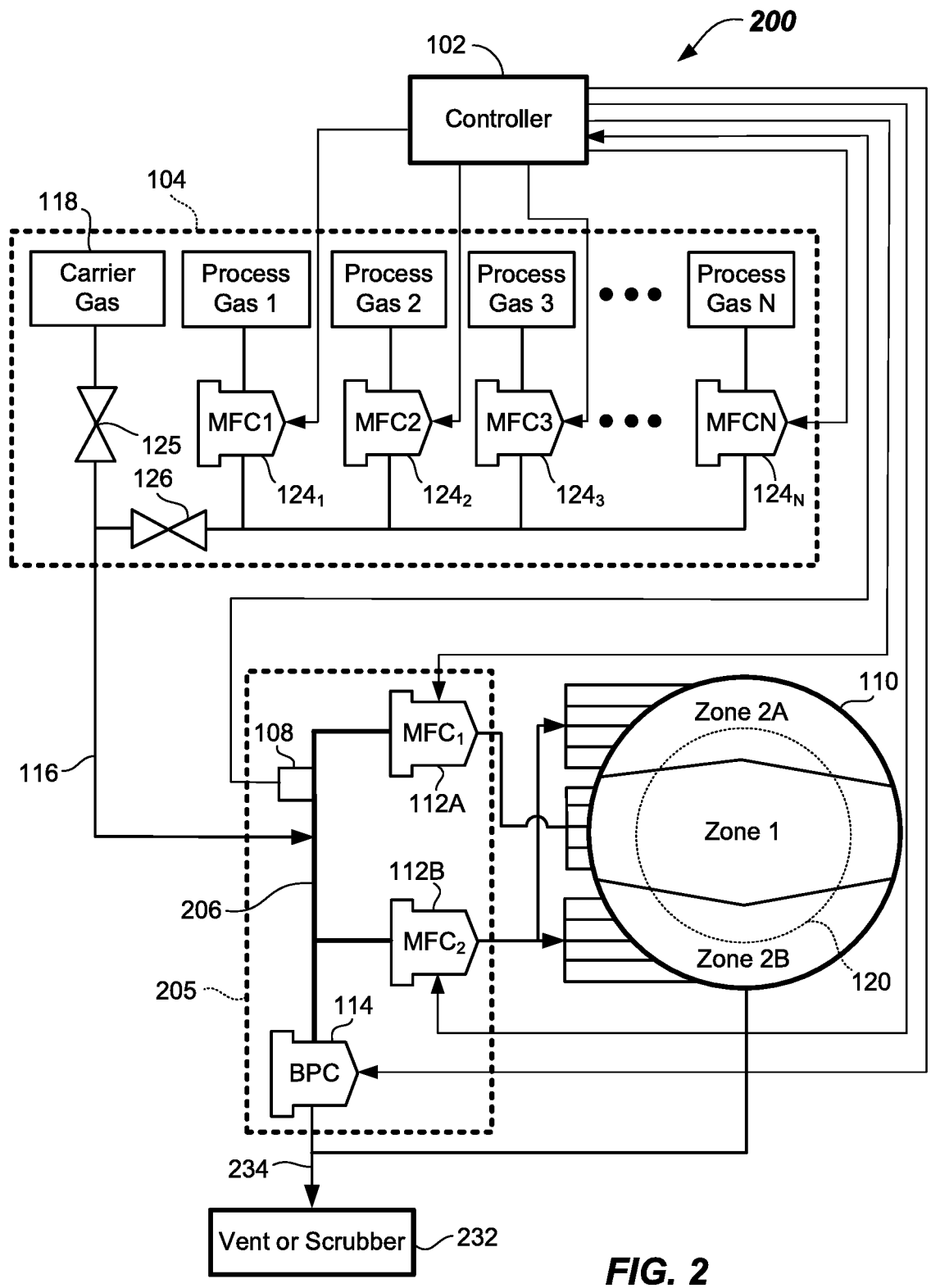
FIG. 2 illustrates a schematic top view of an alternative embodiment of a gas flow control assembly including a mass flow controller and a back pressure controller wherein the back pressure controller output bypasses the process chamber according to one or more embodiments.

FIG. 2 depicts details of an alternate embodiment of a gas flow control assembly 200. The gas flow control assembly 200 includes the controller 102, process gas supply 104, and process chamber 110, identical as previously described. Other items not specifically described are the same as in the FIG. 1 embodiment. In this embodiment, however, the flow ratio apparatus 205 includes a first $MFC_1$ 112A that is operatively and fluidly coupled to a first zone (e.g., Zone 1—a center zone) of the process chamber 110, and a second $MFC_2$ 112B that is operatively and fluidly coupled to at least one other zone (e.g., to Zone 2A and Zone 2B, as shown) of the process chamber 110. The BPC 114 in this embodiment of the flow ratio apparatus 205 controls the back pressure to a back pressure set point (Pb) by way of the controller 102 monitoring back pressure of the distribution manifold 206 via back pressure sensor 108 and making suitable adjustments to an internal control valve in the BPC 114.

As indicated above, the sensor 108 may be integral with BPC 114 in some embodiments, and closed loop control may be accomplished by internal closed loop electronics of the BPC 114 to control the back pressure to the back pressure set point (Pb) supplied to the internal closed loop electronics by controller 102, or in some embodiments by processing carried out by a combination of the internal closed loop electronics of the BPC 114 and the controller 102.

In the FIG. 2 embodiment, the outflow of the BPC 114, rather than feeding to the process chamber 110, bypasses the process chamber 110 and is fluidly coupled with, and flows to, a vent or scrubber 232. The exhaust gas from the exhaust line 234 may be sent to vent, i.e., vented to atmosphere if the gas is not in need of any treatment, or alternatively sent to an abatement system (e.g., a scrubber) should the gas be toxic or flammable and in need of treatment. Any suitable abatement system may be used for treatment, such as is described in US Pub. No. US20100192773; US20100119984; US20090175771; and US20090056544; and in U.S. Pat. Nos. 8,668,868; 8,003,067; and 6,277,347, for example. Other suitable abatement systems may be used.

Each of the MFCs 112A, 112B may have flow set points to be set to between about 0.5% and 100% of the total gas flow. In one embodiment, the first MFC 112A may be set to a flow set point of about 85% of the total flow and the second MFC 112B may be set to a flow set point of about 10% of the total flow and the back pressure set point (Pb) may be set to about 800 Torr via operation of the BPC 114 so that less than about 5% of the total flow is exhausted in exhaust line 234. The total flow may be set slightly higher to account for the gas loss to the vent or scrubber 232. Because there is a constant back pressure of the value set by (Pb) provided in the distribution manifold 206, the first and second MFCs 112A, 112B can be precisely controlled and precisely held at their selected flow set points, and thus precise flow ratio control to multiple zones (e.g., Zone 1, Zone 2A, Zone 2B) of the process chamber 110 may be achieved. Each of the mass flow controllers (e.g., MFC 112A, MFC 112B) may be configured and operatively connected to the process gas supply 104 in parallel so as to supply a high flow of gas from the process gas supply 104 at a flow rate of greater than about 90 slm, greater than 95 slm, or even greater than 100 slm in some embodiments.

Figure 3:
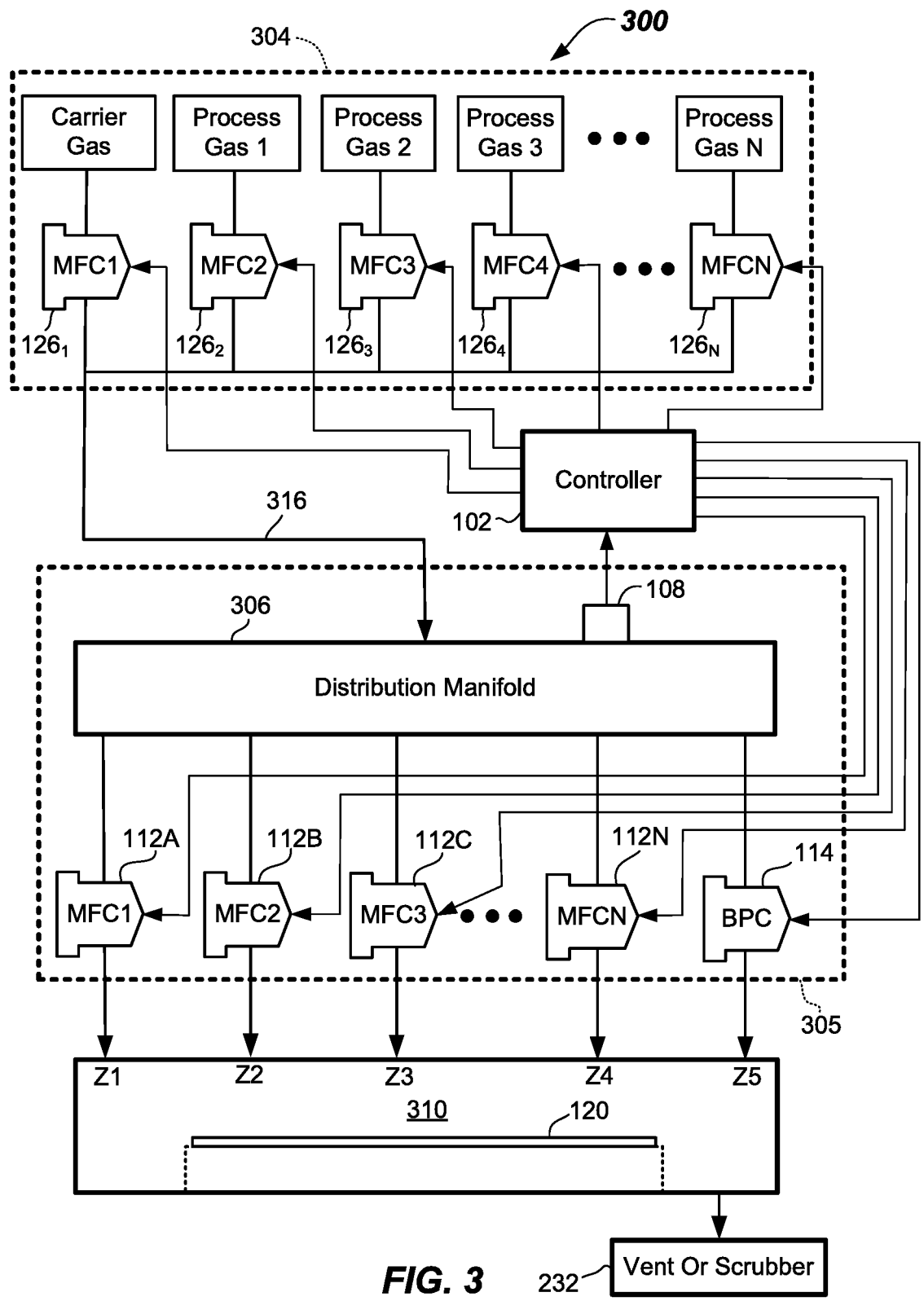
FIG. 3 illustrates a schematic top view of another embodiment of a gas flow control assembly including multiple mass flow controllers and a back pressure controller according to one or more embodiments.
Figure 4:
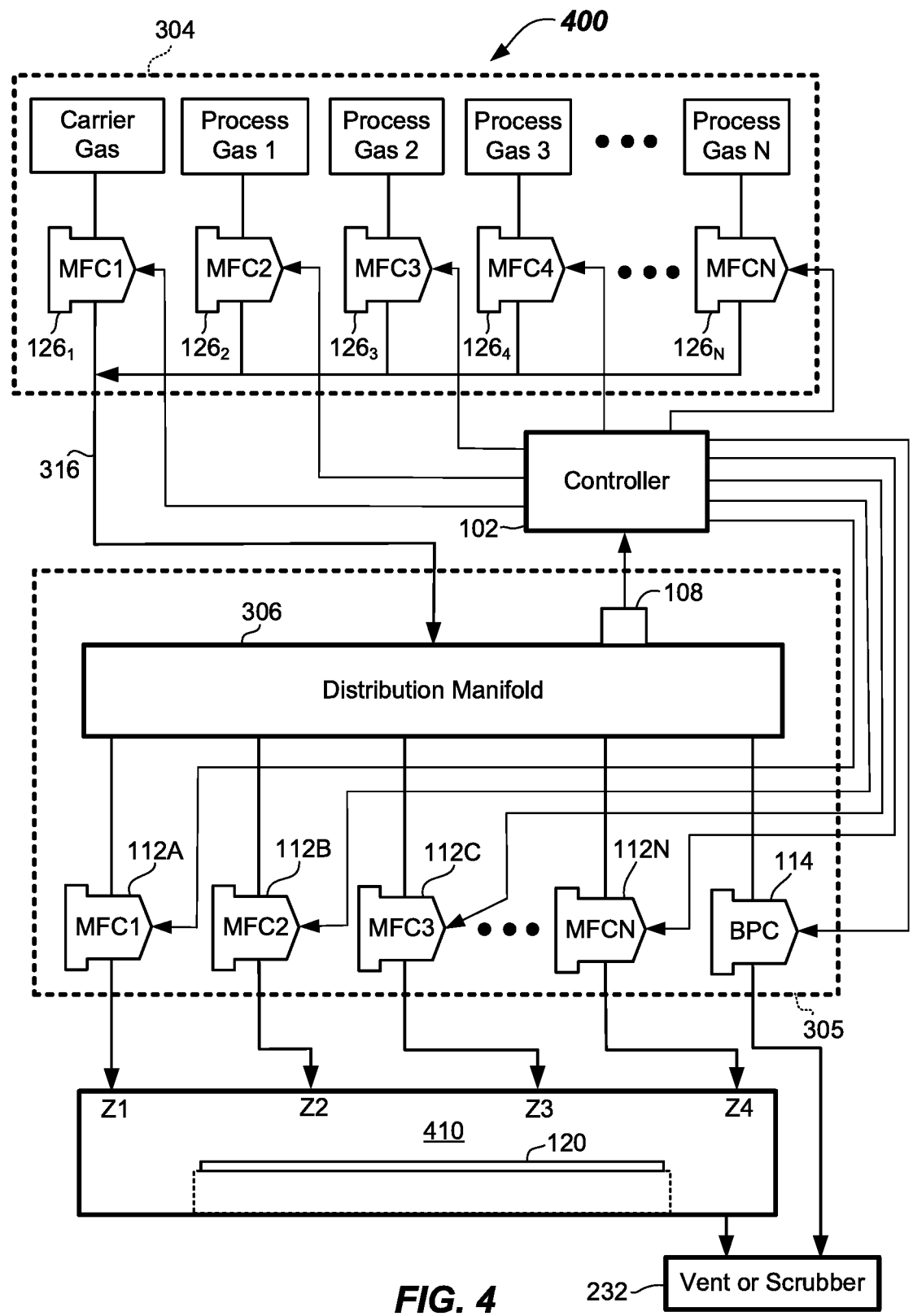
FIG. 4 illustrates a schematic top view of another alternate embodiment of a gas flow control assembly including multiple mass flow controllers and a back pressure controller wherein output from the back pressure controller bypasses the process chamber according to one or more embodiments.

FIGS. 3 and 4 represent additional embodiments of gas flow control assemblies 300, 400 wherein the flow ratio apparatus 305 includes multiple MFCs (e.g., MFCI, MFC2, MFC3, MFC4, . . . , MFCN). As before, these embodiments include a process chamber 310, 410 configured to contain and process substrates 120, and a distribution manifold 306. In this embodiment, a plurality of MFCs 112A-112N may be fluidly coupled between the process chamber 310, 410 and the distribution manifold 306. As before, a back pressure controller 114 is fluidly coupled to the distribution manifold 306. However, in the FIG. 3 embodiment, flow through the BPC 114 is directed to the process chamber 310, whereas in the FIG. 4 embodiment, flow through the BPC 114 bypasses the process chamber 410 entirely and is exhausted instead to a vent or scrubber 232.

The flow ratio apparatus 305 in each embodiment includes the plurality of MFCs 112A-112N, the BPC 114, the distribution manifold 306, and the back pressure sensor 108. As before, the back pressure sensor 108 may be integral with the BPC 114 in some embodiments. In each embodiment, the controller 102 is configured to control flow through each of the one or more MFCs 112A-112N to a specific dynamically-controllable flow set point, i.e., that can be changed as the processing recipe changes. The flow ratio set point for each MFC 112A-112N-1 may be set based upon user prescribed settings. Setting for MFCN 112N may be based upon the total mass flow from the process gas supply less the percentage from each of the other MFC1 through MFCN-1. Likewise, in each embodiment, the back pressure of the distribution manifold 306 may be controlled by controller 102 to the back pressure set point (Pb) that has been set by the user. The control may be responsive to feedback signals from the back pressure sensor 108, and thus, the BPC 114 receives the remaining balance of the total flow. The back pressure set point (Pb) may be based upon the pressure upstream at the process gas supply 304 minus a pressure at the process chamber 310, 410 in some embodiments. In each embodiment, a total mass flow provided in the feed line 316 to the distribution manifold 306 is the sum of the set mass flows from each MFC1-MFCN of carrier gas and process gases 1-N responsive to signals from controller 102. The process gas supply 304 may provide the desired mix of carrier gas 118 and process gases (e.g., Process Gas 1, Process Gas 2, Process Gas 3, . . . , Process Gas N) via control of supply MFCs 1261-126N.

As should be recognized, in each of the foregoing embodiments, adjustments to the percentage of flow ratio to each input port of the process chamber 110, 310, 410 may be adjusted dynamically. The transient time, i.e., settling time for the gas flow control assembly 100, 200, 300, 400 to reach a steady state condition is relatively shortened when the respective flow ratios are changed, as the MFCs 112, and 112A-112N are no longer competing for flow with one another when the BPC 114 is provided in fluid parallel therewith.

Thus, it should be apparent that in the FIG. 3 embodiment, the plurality of mass flow controllers 112A-112N supply the gas from the process gas supply 104 to the plurality of zones (e.g., zone Z1-Z4) of the process chamber 310, and the back pressure controller 114 supplies the gas to another zone (e.g., Z5) of the process chamber 410.

In the FIG. 4 embodiment, flow through MFC1-N 112A-112N are provided to multiple zones (e.g., zones Z1-Z4) and the remaining flow is provided to the back pressure controller 114 which bypasses the process chamber 410 entirely and is exhausted directly to a one of a vent or a scrubber 232. The back pressure set point (Pb) of the back pressure controller 114 may be set as described above.

Figure 5:
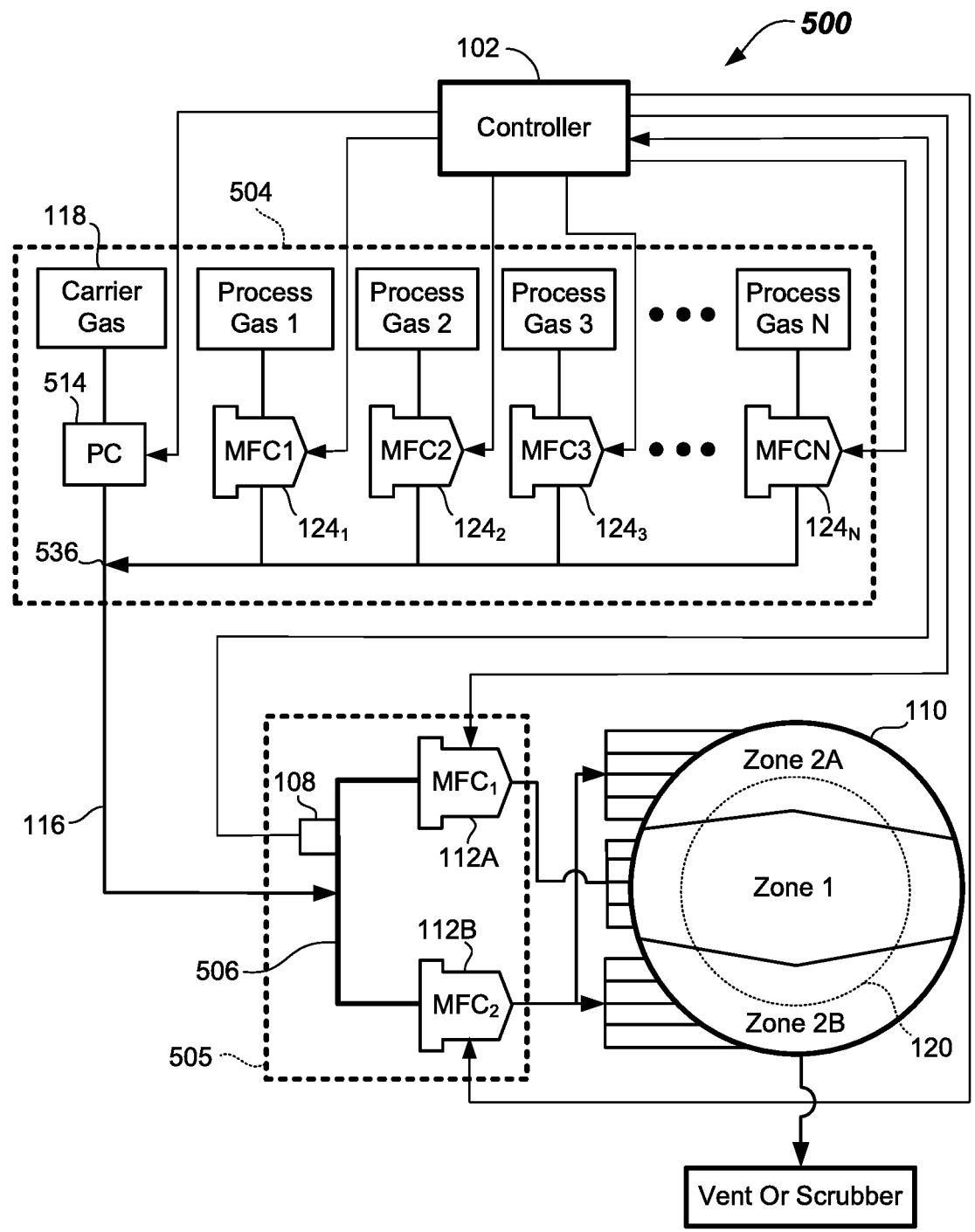
FIG. 5 illustrates a schematic top view of another embodiment of a gas flow control assembly including multiple mass flow controllers and a pressure controller wherein output from a carrier gas supply is pressure controlled according to one or more embodiments.

FIG. 5 illustrates another embodiment of gas flow control assembly 500 including a process gas supply 504 and a flow ratio controller 505, wherein the flow ratio controller 505 is similar to the FIG. 2 embodiment, except that the BPC 114 has been replaced with an upstream pressure controller 514. The upstream pressure controller 514 may be used to control the pressure of the carrier gas 118 supplied into the feed line 116 and thus may be used to remotely control the pressure provided in the manifold 506. Upstream pressure controller may include a valve and internal electronics, and possibly an internal pressure sensor. As before, the back pressure sensor 108 may be integral with the upstream pressure controller 514 in some embodiments and the controller 102 provides the pressure set point. In the depicted embodiment, the upstream pressure controller 514 may be located upstream of a junction 536 where the carrier gas 118 and the one or more Process Gases 1-N mix together. The distribution manifold 506 is fluidly coupled to the process gas supply 504 downstream of the junction 536. In this embodiment, the flow ratio controller 505 includes only two or more mass flow controllers (e.g., $MFC_1$, $MFC_2$) controlling flow, but is devoid of a back pressure controller. Thus, in this embodiment, no gas is wasted as 100% of the gas flowing from the process gas supply 504 is provided to the process chamber 110. This also reduces abatement requirements. Gas flow may be provided to at least as many or more zones (e.g., Zone 1, Zone 2A, Zone 2B) of the process chamber 110 as the number of MFCs (e.g., MFC1, MFC2)

Figure 6:
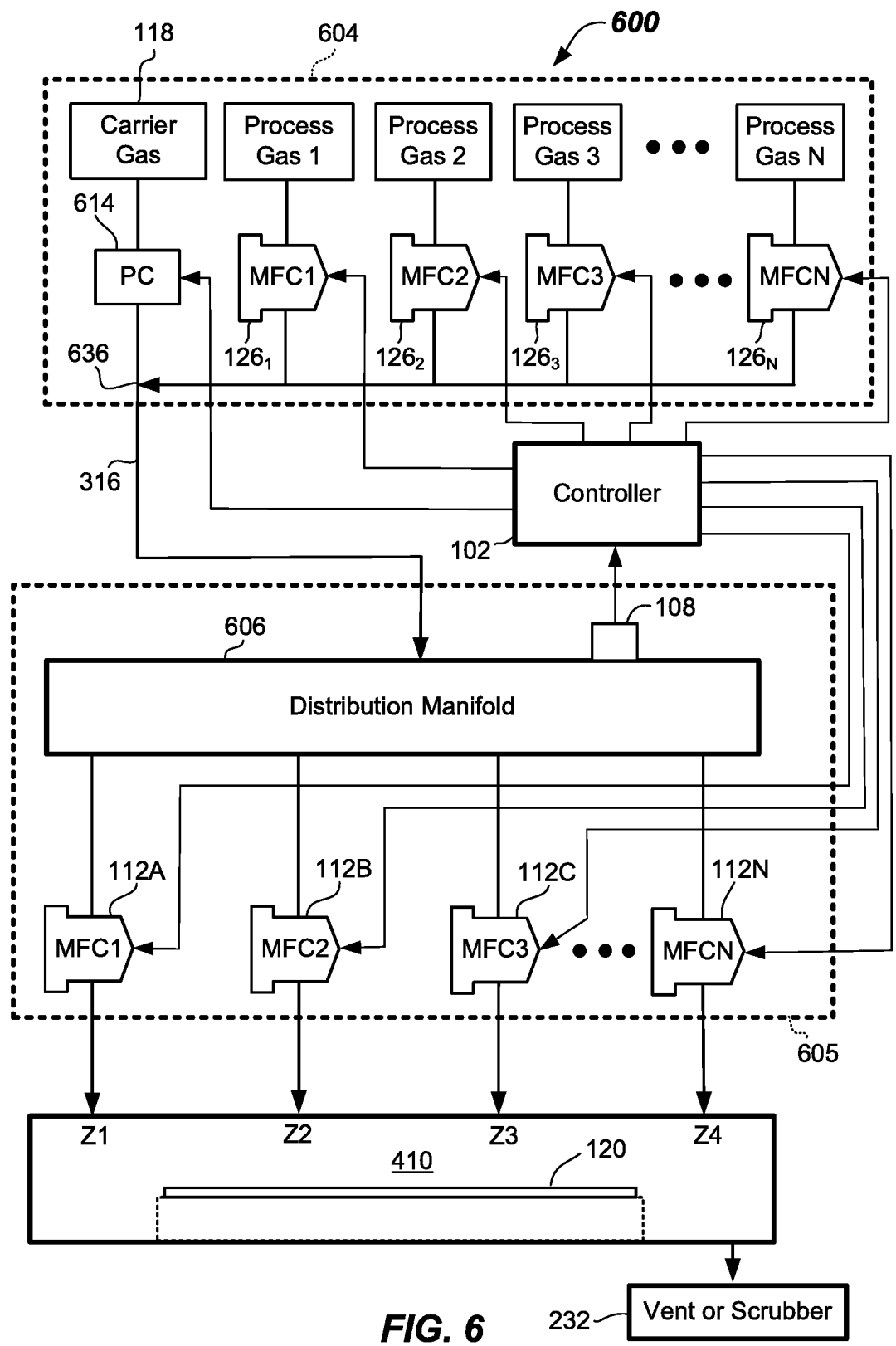
FIG. 6 illustrates a schematic top view of an alternative embodiment of a gas flow control assembly including multiple mass flow controllers and a pressure controller wherein output from a carrier gas supply is pressure controlled according to one or more embodiments.

FIG. 6 illustrates another alternative embodiment of gas flow control assembly 600 including a flow ratio controller 605, wherein the flow ratio controller 605 is similar to the FIG. 3 embodiment, except that the BPC 114 has been replaced with an upstream pressure controller 614. The upstream pressure controller 614 may be used to control the pressure of the carrier gas 118 supplied into the feed line 316 and thus may be used to remotely control the pressure provided in the manifold 606. As before, the back pressure sensor 108 may be integral with the upstream pressure controller 614 in some embodiments. As in FIG. 5, the upstream pressure controller 614 may be located upstream of a junction 536 where the carrier gas 118 and the one or more Process Gases 1-N mix together. In this embodiment, the flow ratio controller 605 includes only a plurality of mass flow controllers (e.g., MFC1, MFC2, MFC3, . . . , MFCN) controlling flow into the process chamber 610, but is devoid of a back pressure controller 114. Thus, in this embodiment, no gas is wasted as 100 of the gas is provided to the process chamber 410 thereby reducing abatement requirements. Gas flow may be provided to at least as many or more zones (e.g., Zone Z1-Z4) of the process chamber 410 as there are numbers of MFCs.

Figure 7:
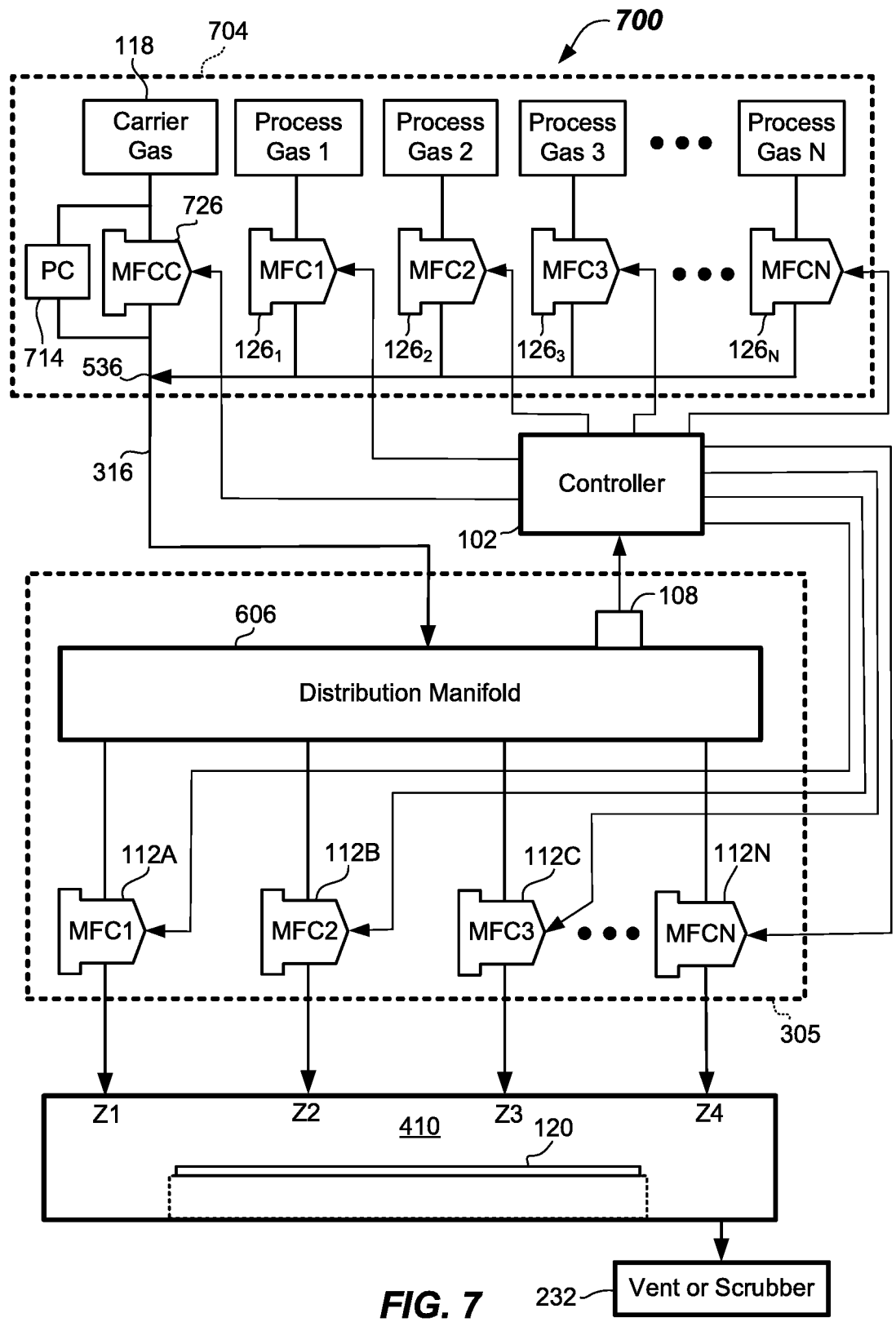
FIG. 7 illustrates a schematic top view of an alternative embodiment of a gas flow control assembly including multiple mass flow controllers and a pressure controller wherein output from a carrier gas supply is pressure controlled according to one or more embodiments.

FIG. 7 illustrates another alternative embodiment of gas flow control assembly 700 including a process gas supply 704 and a flow ratio controller 605, wherein the flow ratio controller 605 is identical to that described in the FIG. 6 embodiment. In this embodiment, an upstream pressure controller 714 may be used to control the pressure of the carrier gas 118 supplied into the feed line 316 and thus may be used to remotely control the pressure provided in the manifold 606. As before, the back pressure sensor, 108 may be integral with the upstream pressure controller 714 in some embodiments. As in FIGS. 5 and 6, the upstream pressure controller 714 may be located upstream of a junction 536 where the carrier gas 118 and the one or more Process Gases 1-N are mixed together. In this embodiment, the pressure controller 714 may be provided in a fluid parallel relationship with a carrier gas MFCC 726. Thus, in this embodiment also, no gas is wasted as 100% of the gas is provided to the process chamber 410 thereby reducing abatement requirements. Only a part of the carrier gas flows through the upstream pressure controller 714. Thus, the carrier gas MFCC 726 can be set to a desired flow set point, and the upstream pressure controller 714 may be modulated to control the back pressure of the distribution manifold 606 to the desired back pressure set point (Pb). It should be understood that the arrangement of pressure controller 714 provided in a fluid parallel relationship with a carrier gas MFCC 726 may be applied to the structure shown in FIG. 5, thereby replacing pressure controller 514, with all else remaining the same.

Figure 8:
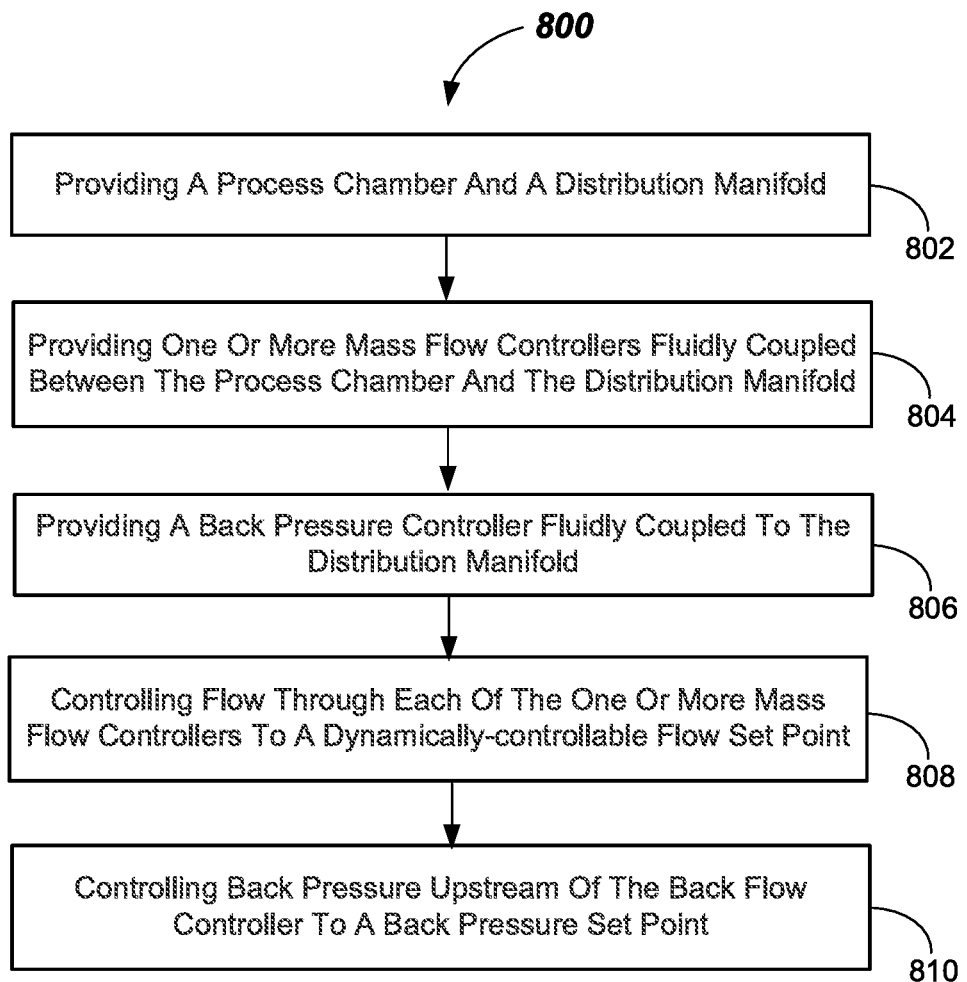
FIG. 8 illustrates a flowchart of a method of controlling flow of a gas to a processing chamber including back pressure control according to one or more embodiments.

FIG. 8 illustrates a flowchart depicting an example method of controlling flow of a gas to a process chamber (e.g., process chamber 110, 310, 410) according to one or more embodiments of the present invention. The method 800 includes, in 802, providing a process chamber (e.g., process chamber 110, 310, 410) and a distribution manifold (e.g., distribution manifold 106, 206, or 306), providing one or more mass flow controllers (e.g., MFCs 112, 112A and 112B, or 112A-112N) fluidly coupled between the process chamber (e.g., process chamber 110, 310, 410) and the distribution manifold (e.g., distribution manifold 106, 206, 306) in 804, and providing a back pressure controller (e.g., back pressure controller 114) fluidly coupled to the distribution manifold (e.g., distribution manifold 106, 306) in 806.

The method 800 further includes, in 808, controlling flow through each of the one or more mass flow controllers (e.g., MFCs 112, 112A and 112B, or 112A-112N) to a dynamically-controllable flow ratio set point, and, in 810, controlling back pressure upstream of the back pressure controller (e.g., back pressure controller 114) to a back pressure set point (Pb).

Note that although the above example method 800 is described as a sequence of discrete steps, embodiments of the invention are not so limited. The steps described are merely for illustrative purposes to facilitate understanding of one or more embodiments of the invention. Any number of additional or intermediate steps may be included, several steps may be omitted or combined, and any parts of any of the steps may be broken into sub-steps. In addition, the particular sequence in which the steps are presented is merely to facilitate understanding of the invention and it should be understood that these steps, or any combination or sub-steps, may be performed in any suitable order, including simultaneously.

The dynamically-controllable flow set point in 808 for each of the one or more mass flow controllers (e.g., MFCs 112, 112A and 112B, or 112A-112N) may be set to any percentage of the total flow rate within the allowable range. In some embodiment, the nominal flow rate for the one or more mass flow controllers (e.g., MFCs 112, 112A and 112B, or 112A-112N) may be controlled to +/−1%, and thus very accurate control of flow ratio between the respective MFCs is possible. Accordingly, it should be recognized that precise flow splitting for 2 or more channels may be accomplished. Further, because the MFCs are no longer fighting with one another, flow imbalances may be reduced, and settling times of less than about 1 second for changes in respective flow ratios of the mass flow controllers (e.g., MFCs 112, 112A and 112B, or 112A-112N) may be achieved. Further, simple control algorithms may be used for implementing the back pressure control, such as simple error feedback control, proportional control, and the like. Obviously more sophisticated feed forward controls or predictive controls may be used, but adequate response time may be achieved even using simple feedback control methods.

Figure 9:
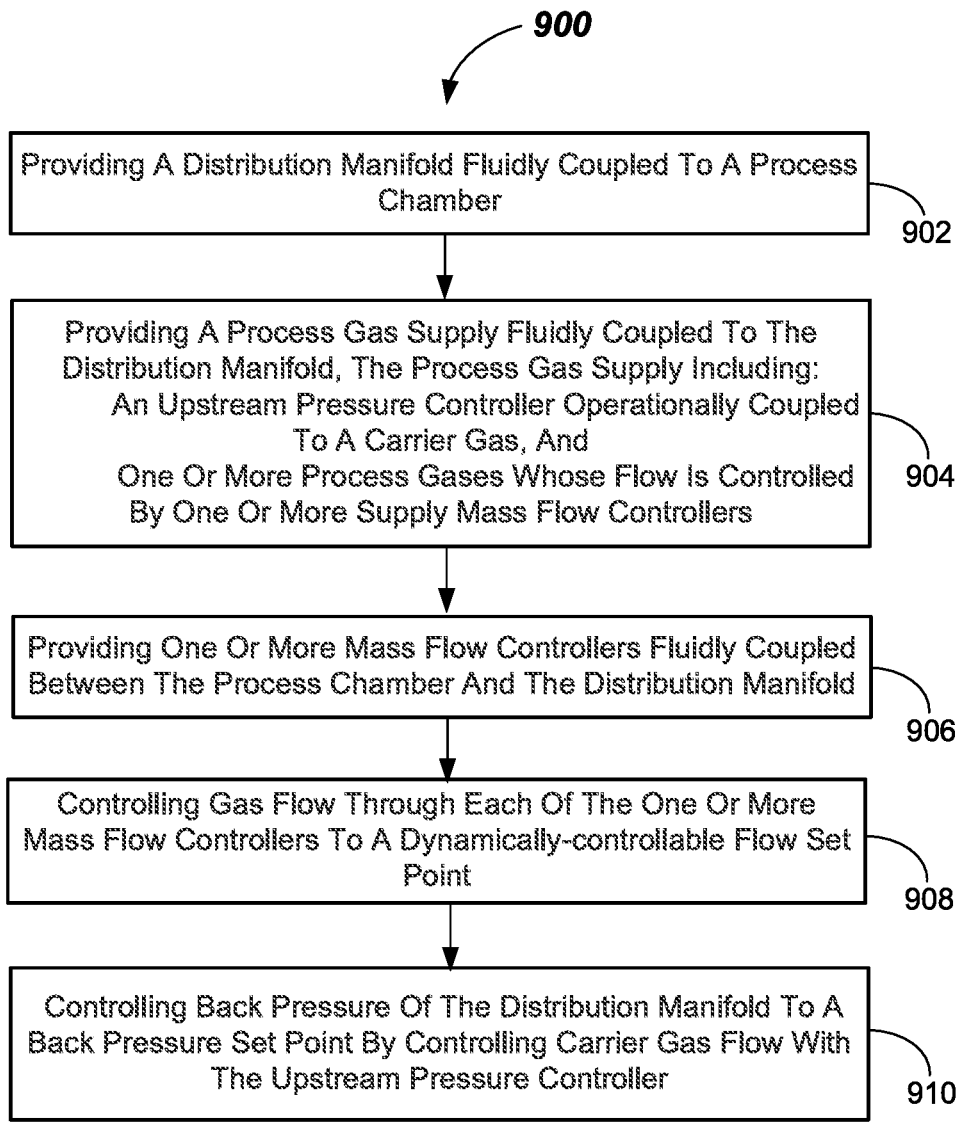
FIG. 9 illustrates a flowchart of a method of controlling flow of a gas to a processing chamber including pressure control of output from a carrier gas supply according to one or more embodiments.

FIG. 9 illustrates a flowchart depicting another example method of controlling flow of a gas to a process chamber (e.g., process chamber 110, 410) according to one or more embodiments of the present invention. The method 900 includes, in 902, providing a distribution manifold (e.g., distribution manifold 506, 606) fluidly coupled to a process chamber (e.g., process chamber 110, 410). The method 900 further includes, in 904, providing a process gas supply (e.g., process gas supply 504, 604, 704) fluidly coupled to the distribution manifold, the process gas supply including an upstream pressure controller (e.g., upstream pressure controller 514, 614, 714) operationally coupled to a carrier gas (e.g., carrier gas 118), and one or more process gases (e.g., Process Gas 1, Process Gas 2, Process Gas 3, . . . , Process Gas N) whose flow is controlled by one or more supply mass flow controllers (e.g., supply mass flow controllers $124_1$, $124_2$, $124_3$, . . . , $124_N$).

The method 900 further includes, in 906, providing one or more mass flow controllers (e.g., MFC1 112A and MFC2 112B, or MFC1 112A through MFCN 112N) fluidly coupled between the process chamber and the distribution manifold.

Operationally, the method 900 includes, in 908, controlling gas flow through each of the one or more mass flow controllers (e.g., MFC1 112A and MFC2 112B, or MFC1 112A through MFCN 112N) to a dynamically-controllable flow set point, and, in 910, controlling back pressure of the distribution manifold to a back pressure set point (e.g., back pressure set point Pb) by controlling carrier gas flow with the upstream pressure controller (e.g., upstream pressure controller 514, 614, 714).

Although certain carrier gases and process gases and certain pressure ranges and flow rates are described herein, it should be understood that embodiments of the present invention are equally useable with other gases, pressure ranges, and gas flow rates.

Accordingly, while the present invention has been disclosed in connection with example embodiments thereof, it should be understood that other embodiments may fall within the scope of the invention, as defined by the following claims.

What is claimed is:

1. A system comprising:
a process chamber;
a set of mass flow controllers fluidly coupled to the process chamber, wherein each of the set of mass flow controllers are configured to flow at least one of a process gas or a carrier gas into a respective zone of the process chamber;
a distribution manifold fluidly coupled to each of the set of mass flow controllers;
a process gas supply fluidly coupled to the distribution manifold, wherein the process gas supply is configured to provide at least one of the process gas or the carrier gas to the process chamber via the distribution manifold and the set of mass flow controllers;
a back pressure controller fluidly coupled to the distribution manifold configured to control a back pressure within the distribution manifold in view of a back pressure reading by a back pressure sensor of the distribution manifold;
a master controller operatively coupled to each of the set of mass flow controllers, the process gas supply, the back pressure controller, and the back pressure sensor of the distribution manifold, wherein the master controller is configured to:
determine a first flow setpoint for at least one of a process gas flow or a carrier gas flow through a first mass flow controller of the set of mass flow controllers;
obtain a back pressure setpoint of the distribution manifold;
determine, in view of the determined first flow setpoint and the obtained back pressure setpoint, a second flow setpoint for at least one of the process gas flow or the carrier gas flow through at least one of a second mass flow controller of the set of mass flow controllers or the back pressure controller;
control at least one of the process gas flow or the carrier gas flow through the first mass flow controller to the first flow setpoint and at least one of the second mass flow controller or the back pressure controller to the second flow setpoint; and
control the back pressure of the distribution manifold to the back pressure setpoint in view of the back pressure reading provided by the back pressure sensor of the distribution manifold.

2. The system of claim 1, wherein the master controller is further configured to:
control the carrier gas flow to a junction where the carrier gas flow and the process gas flow are mixed.

3. The system of claim 2, wherein the master controller is configured to control the carrier gas flow to the junction to be mixed with the process gas flow in view of the obtained back pressure setpoint.

4. The system of claim 1, wherein at least one of the first flow setpoint or the second flow setpoint correspond to a flow rate of greater than 90 slm.

5. The system of claim 1, wherein the second flow setpoint is further determined in view of a target flow ratio associated with at least one of the carrier gas flow or the process gas flow via the set of mass flow controllers and the back pressure controller.

6. The system of claim 1, wherein the master controller is configured to control only a portion of the carrier gas flow through the back pressure controller.

7. The system of claim 1, wherein the master controller is a digital controller comprising a processor.

8. A method comprising:
determining, by a master controller, a first flow setpoint for a flow of at least one of a process gas flow or a carrier gas flow through a first mass flow controller of a set of mass flow controllers fluidly coupled to a process chamber;
obtaining, by the master controller, a back pressure setpoint of a distribution manifold fluidly coupled to each of the set of mass flow controllers;
determining, by the master controller and in view of the determined first flow setpoint and the obtained back pressure setpoint, a second flow setpoint for at least one of the process gas flow or the carrier gas flow through at least one of a second mass flow controller of the set of mass flow controllers or a back pressure controller fluidly coupled to the distribution manifold;
controlling, by the master controller, at least one of the process gas flow or the carrier gas flow through the first mass flow controller to a first flow setpoint and at least one of the second mass flow controller or the back pressure controller to the second flow setpoint; and
controlling, by the master controller, a back pressure of the distribution manifold to the back pressure setpoint in view of a back pressure reading provided by a back pressure sensor of the distribution manifold.

9. The method of claim 8, further comprising:
controlling, by the master controller, the carrier gas flow to a junction where the carrier gas flow and the process gas flow are mixed.

10. The method of claim 9, wherein the master controller is configured to control the carrier gas flow to the junction to be mixed with the process gas flow in view of the obtained back pressure setpoint.

11. The method of claim 8, wherein at least one of the first flow setpoint or the second flow setpoint correspond to a flow rate of greater than 90 slm.

12. The method of claim 8, wherein the second flow setpoint is further determined in view of a target flow ratio associated with at least one of the carrier gas flow or the process gas flow via the set of mass flow controllers and the back pressure controller.

13. The method of claim 8, wherein the master controller is configured to control only a portion of the carrier gas flow through the back pressure controller.

14. The method of claim 8, wherein the master controller is a digital controller comprising a processor.

15. A method comprising:
providing, by a master controller, a carrier gas via a carrier gas supply and a process gas via a process gas supply to a distribution manifold operationally coupled to a process chamber and each of a set of mass flow controllers;
determining, by the master controller and in view of a target flow ratio for at least one of a process gas flow or a carrier gas flow through one or more of the set of mass flow controllers or a back pressure controller and a back pressure setpoint, a first flow setpoint associated with a first mass flow controller of the set of mass flow controllers and a second flow setpoint associated with at least one of a second mass flow controller of the set of mass flow controllers or a the back pressure controller;

controlling, by the master controller, at least one of the process gas flow or the carrier gas flow through the first mass flow controller to the first flow setpoint and at least one of the second mass flow controller or the back pressure controller to the second flow setpoint;

receiving, by the master controller, an indication of a back pressure of the distribution manifold from a back pressure sensor; and controlling, by the master controller, the back pressure of the distribution manifold to the back pressure setpoint in view of the indication received from the back pressure sensor.

16. The method of claim 15, wherein controlling the back pressure of the distribution manifold comprises:

controlling, by the master controller, the carrier gas flow through the back pressure controller.

17. The method of claim 15, further comprising:

controlling, by the master controller, the carrier gas flow to a junction where the carrier gas flow and the process gas flow are mixed.

18. The method of claim 15, wherein at least one of the first flow setpoint or the second flow setpoint correspond to a flow rate of greater than 90 slm.

19. The method of claim 15, wherein the master controller is configured to control only a portion of the carrier gas flow through the back pressure controller.

20. The method of claim 15, wherein the master controller is a digital controller comprising a processor.

* * * * *